(12) United States Patent
Sasaki et al.

(10) Patent No.: US 6,911,844 B2
(45) Date of Patent: Jun. 28, 2005

(54) ELECTRONIC CIRCUIT APPARATUS AND INTEGRATED CIRCUIT DEVICE

(75) Inventors: Naoto Sasaki, Kanagawa (JP); Teruo Hirayama, Kanagawa (JP)

(73) Assignee: Sony Corporation (JP)

( * ) Notice: Subject to any disclaimer, the term of this patent is extended or adjusted under 35 U.S.C. 154(b) by 49 days.

(21) Appl. No.: 10/603,688

(22) Filed: Jun. 26, 2003

(65) Prior Publication Data
US 2004/0080341 A1 Apr. 29, 2004

(30) Foreign Application Priority Data
Jun. 28, 2002 (JP) .................................... P2002-191064

(51) Int. Cl.7 .......................................... H03K 19/094
(52) U.S. Cl. ........................ 326/86; 326/68; 326/30
(58) Field of Search ........................ 326/86, 68, 30, 326/41

(56) References Cited

U.S. PATENT DOCUMENTS 4,853,560 A * 8/1989 Iwamura et al. ............... 326/86
5,111,080 A * 5/1992 Mizukami et al. ............. 326/86
5,729,154 A * 3/1998 Taguchi et al. ................ 326/86
6,160,417 A * 12/2000 Taguchi ........................ 326/86

* cited by examiner

Primary Examiner—Michael Tokar
Assistant Examiner—Lam T. Mai
(74) Attorney, Agent, or Firm—Rader, Fishman & Grauer PLLC; Ronald P. Kananen (57) ABSTRACT

An electronic circuit apparatus and integrated circuit device, wherein an arrangement of connection terminals, external connection terminals and input/output interface circuits of a semiconductor chip as a unit circuit device is optimized so as to attain a suppression of a power consumption and a shorter signal transmission time, configured that only connection pads are allocated to be arranged on a mutually adjacent side of semiconductor chips 1 and 2, and input/output interface circuits, test pads and external connection pads are arranged along the remaining three sides, moreover, the connection pads and the electronic circuits are directly connected and not connected via the input/output interface circuits.

8 Claims, 5 Drawing Sheets

ELECTRONIC CIRCUIT APPARATUS AND INTEGRATED CIRCUIT DEVICE

BACKGROUND OF THE INVENTION

1. Field of the Invention

The present invention relates to an electronic circuit apparatus and particularly to an electronic circuit apparatus applied with a so-called multi-chip module technique of assembling a plurality of unit circuit devices, such as semiconductor chips, as one electronic device, and an integrated circuit device used therein.

2. Description of the Related Art

Along with evolutions in the digital network information society, digital home-use appliances have evolved as multimedia apparatuses and compact electronic apparatuses represented by portable information terminals have developed remarkably. As a result, demands for smarter and more advanced large scale integrated circuits (LSI) have increased and a System-on-chip (SOC) installed with sophisticated system functions on one chip has been focused.

The system-on-chip is to realize on one silicon LSI chip a system which has conventionally been realized by a substrate mounted with a large number of discrete devices, and it has the large advantages of a low power consumption, a high performance and a reduction of mounting area.

Recently, however, a longer period of developing the system-on-chip and a development risk for integrating a variety of system functions on one chip have become concerns, and attention has drawn to a system-in-package (SIP) technique potentially able to realize equivalent functions to those of the system-on-chip by a short time and a low cost.

The system-in-package has realized a system by installing a plurality of LSIs on a single package, which is a kind of multi-chip module. The system-in-package finally aims to supply equivalent functions to those of the system-on-chip at a low cost.

In a multi-chip module of the related art, such as the system-in-package, an outermost rim portion of respective semiconductor chips mounted on a substrate is provided with a plurality of connection pads for connecting with other semiconductor chips. In each of the respective semiconductor chips, input/output interface circuits for electrical matching, for example, adjustment of a voltage level between the semiconductor chip and an electronic device connected to outside the module, are provided between the plurality of connection pads and electronic circuits integrated on the chip for realizing the functions of the system. Electrical connection between the semiconductor chips is made by connecting the connection pads of a plurality of semiconductor chips to be connected to each other by wire bonding or soldering ball, etc.

In a lecture on packaging in session 9 at the SEMI Technology Symposium 2001, it was pointed out that when using standard chips as semiconductor chips to be mounted for reducing the costs in the system-in-package of the related art, an excessive power consumption is caused by using standard interface circuits. This is because of an increase of the load capacity in signal paths due to the existence of input/output interfaces. Also, in this lecture, it was proposed to mount on a semiconductor chip input/output interface circuits with a low load capacity for multi-chip modules separately from standard input/output interface circuits.

In a multi-chip module, such as the system-in-package, mounted with a plurality of semiconductor chips, however, the pads of each semiconductor chip include not only pads used for connecting between electronic circuits in the chip with outside the module but also pads used for mutually connecting inside semiconductor chips.

Accordingly, it is a waste of an area to provide an input/output interface between all pads and electronic circuits. Furthermore, it leads to an addition of a load capacity to signal paths and charging/discharging thereof increases power consumption, so that when the input/output interface circuit is provided for all pads, excessive power is consumed as a whole.

From the above viewpoint, the Japanese Unexamined Patent Publication No. H7-153902 discloses a technique of preparing a semiconductor chip composed only of a core portion of a logic circuit and preparing a semiconductor chip on which only an input/output interface circuit is formed at an outer rim portion of the system-in-package so as to connect between semiconductor chips composed only of a core portion without using an input/output interface circuit.

However, to realize a high speed system-in-package with a low power consumption, it is important to apply neither a method of using standard semiconductor chips as in the related art nor a method of uniformly producing semiconductor chips having separated functions, as in the technique described in the Japanese Unexamined Patent Publication No. H7-153902, but to design a layout wherein an arrangement of pads and input/output interface circuits, etc. formed on the respective semiconductor chips becomes optimal so as to attain the shortest distance connection between the respective semiconductor chips in consideration of the arrangement and connection relationship of the plurality of semiconductor chips to be mounted for realizing desired functions.

SUMMARY OF THE INVENTION

An object of the present invention is to provide an electronic circuit apparatus realizing a suppression of power consumption and a shorter signal transmission time by optimizing an arrangement of connection terminals between semiconductor chips and other devices, external connection terminals and input/output interface circuits, and an integrated circuit device used therein.

To attain the above object, according to the present invention, there is provided an electronic circuit apparatus, wherein a plurality of unit circuit devices each having an electronic circuit is mounted adjacent to each other on a substrate and the unit circuit devices are mutually electrically connected, wherein each of the unit circuit devices comprises: an input/output interface circuit; a plurality of device connection terminals arranged on a side adjacent to the other unit circuit devices and connected respectively to the electronic circuit by inter-connection not via the input/output interface circuit; and a plurality of external connection terminals arranged on a side not adjacent to the other unit circuit devices and connected respectively to the electronic circuit by inter-connection via the input/output interface circuit.

To attain the above object, according to the present invention, there is provided an integrated circuit device comprising electronic circuits, a plurality of which is mounted adjacent to each other in one module, and the electronic circuits are electrically connected, comprising: an input/output interface circuit; a plurality of device connection terminals arranged on a side adjacent to other integrated circuit devices when mounted on a module and connected respectively to the electronic circuit by inter-connection not via the input/output interface circuit; and a plurality of external connection terminals arranged on a side not adjacent to the other integrated circuit devices and connected respectively to the electronic circuit by inter-connection via the input/output interface circuit.

In the present invention, preferably, the unit circuit device comprises a plurality of test terminals for a test on the electronic circuit arranged on a side not adjacent to the other unit circuit devices; and, the test terminals are connected respectively to the electronic circuit by inter-connection via the input/output interface circuit.

In the present invention, preferably, the unit circuit device has a plurality of test terminals for a test on the electronic circuit arranged on a side adjacent to the other unit circuit devices and inside the device connection terminals; and, the test terminals are connected respectively to the electronic circuit by inter-connection via the input/output interface circuit.

In the present invention, preferably, the external connection terminals serve as connection terminals for connecting with outside the electronic circuit apparatus and also as connection terminals for a test on the electronic circuit.

In the electronic circuit apparatus of the present invention, a plurality of device connection terminals connected respectively to the electronic circuit by inter-connection not via the input/output interface circuit is arranged on a side adjacent to other unit circuit devices and need to be connected in respective unit circuit devices. In this case, comparing with the case where the device connection terminals are provided on any sides and not always next to each other, a distance between the device connection terminals of the unit circuit devices that need to be connected becomes shorter and signals are transmitted between electronic circuits of the respective unit circuit devices without passing through input/output interfaces.

DESCRIPTION OF THE PREFERRED EMBODIMENT

Below, embodiments of an electronic circuit apparatus of the present invention will be explained with reference to the drawings.

First Embodiment

Figure 1:
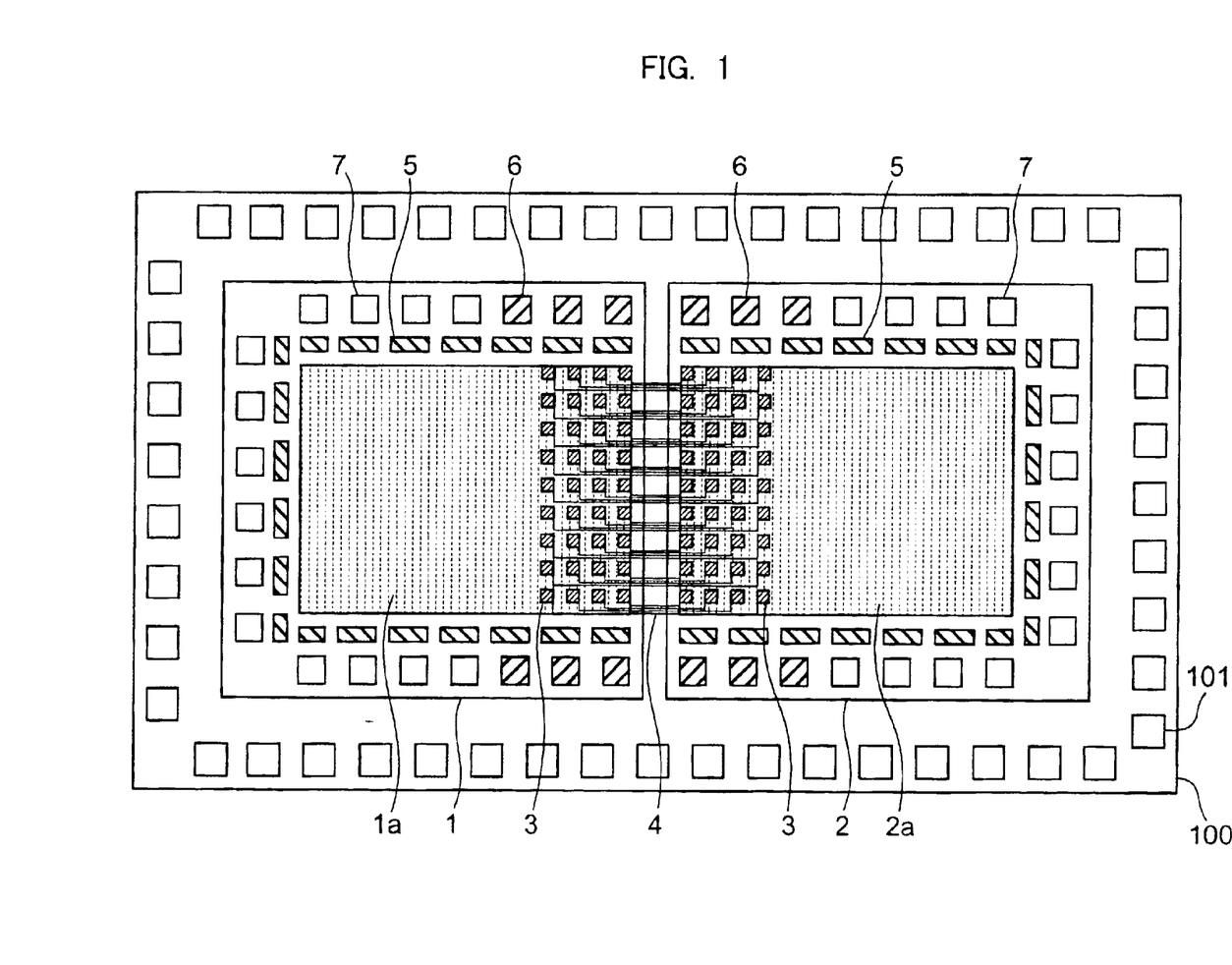
FIG. 1 is a plan view of an example of an electronic circuit apparatus according to a first embodiment.

FIG. 1 is a plan view of an electronic circuit apparatus according to the present embodiment being applied by a so-called multi-chip module technique.

As shown in FIG. 1, in the electronic apparatus according to the present embodiment, a supporting substrate 100 made of silicon, etc. and called an interposer is mounted with two semiconductor chips 1 and 2.

The first semiconductor chip 1 comprises an electronic circuit 1a, such as a logic circuit or a memory circuit, wherein a plurality of connection pads 3 for connecting with the second semiconductor chip 2 is arranged on the side adjacent to the second semiconductor chip 2, for example, along a side adjacent to the second semiconductor chip 2. The connection pad 3 is smaller than a later explained test pad 6 and test/connection pad 7 and is, for example, 30 $\mu$m×30 $\mu$m or less.

The connection pads 3 are electrically connected to the electronic circuit 1a by inter-connection (not shown) not via an input/output interface circuit (I/O circuit). Due to this, the first semiconductor chip 1 can directly transmit a signal from the electronic circuit 1a to the second semiconductor chip 2 not via the I/O circuit. Also, to attain this arrangement of the connection pads 3, it is preferable to design so that circuit blocks for performing transmission of signals with the second semiconductor chip 2 among circuit blocks composing the electronic circuit 1a of the first semiconductor chip are allocated on the second semiconductor chip 2 side.

Furthermore, in the first semiconductor chip 1, a plurality of input/output interface circuits 5 for connecting with the electronic circuit 1a is arranged outside the electronic circuit 1a on a side not adjacent to the second semiconductor chip 2, for example, along the three sides other than the side adjacent to the second semiconductor chip 2.

The input/output interface circuit 5 has a function of substantially matching voltage levels of signals to be handled between an external apparatus and the semiconductor chip. The input/output interface is, for example, an input buffer for detecting a signal from outside the semiconductor chip, an output buffer for driving a signal to outside the chip, a bus type bidirectional buffer, etc.

Outside the input/output interface circuits 5 is arranged test pads 6 for bringing to contact a prober, etc. at the time of conducting a function test and other tests on the electronic circuit 1a and a plurality of test/connection pads 7 for bringing to contact the prober, etc. during the test and used for connecting with the supporting substrate also after the test. Note that the test/connection pads 7 correspond to an embodiment of "external connection terminals" of the present invention.

The test pad 6 and the test/connection pad 7 are connected to the electronic circuit 1a by interconnection (not shown) via the input/output interface circuit 5. Due to this, matching is performed, such as matching voltage levels, on signals transmitted to and from the external apparatus during the test and in use, and electrical transmission of signals is performed.

The second semiconductor chip 2 comprises an electronic circuit 2a, such as a logic circuit or a memory circuit, wherein a plurality of connection pads 3 for connecting with the first semiconductor chip 1 is arranged along a side adjacent to the first semiconductor chip 1.

The connection pads 3 are electrically connected directly with the electronic circuit 1a by interconnection (not shown) not via the input/output interface circuit. Also, to attain this arrangement of the connection pads 3, it is designed so that circuit blocks for performing transmission of signals with the first semiconductor chip 1 among circuit blocks composing the electronic circuit 2a of the second semiconductor chip are allocated to the first semiconductor chip 1 side.

Furthermore, in the second semiconductor chip 2, a plurality of input/output interface circuits 5 for connecting to the electronic circuit 2a is arranged outside the electronic circuit 2a on a side not adjacent to the first semiconductor chip 1, for example, along the three sides other than the side adjacent to the first semiconductor chip 1.

Outside the input/output interface circuit 5 is arranged a plurality of test pads 6 and test/connection pads 7 connected to the electronic circuit 1a by inter-connection (not shown) via the input/output interface circuit 5 in the same way as in the first semiconductor chip 1.

As a result of the connection pads 3 of, the above first semiconductor chip 1 and second semiconductor chip 2 being connected to each other by connection wiring 4, the first semiconductor chip 1 and second semiconductor chip 2 are electrically connected.

The electronic circuit apparatus according to the present embodiment is configured as shown in FIG. 1, when assuming the two semiconductor chips 1 and 2 as one group, and the interface circuits 5, the test pads 6 and the external connection pads 7 are arranged around a rim portion of the group of semiconductors 1 and 2, and has a configuration close to a system LSI wherein the electronic circuits 1a and 2a are formed on substantially one chip.

Connection of the first semiconductor chip 1 and the second semiconductor chip 2 by the connection wiring 4 is realized, for example, as below.

Figure 2:
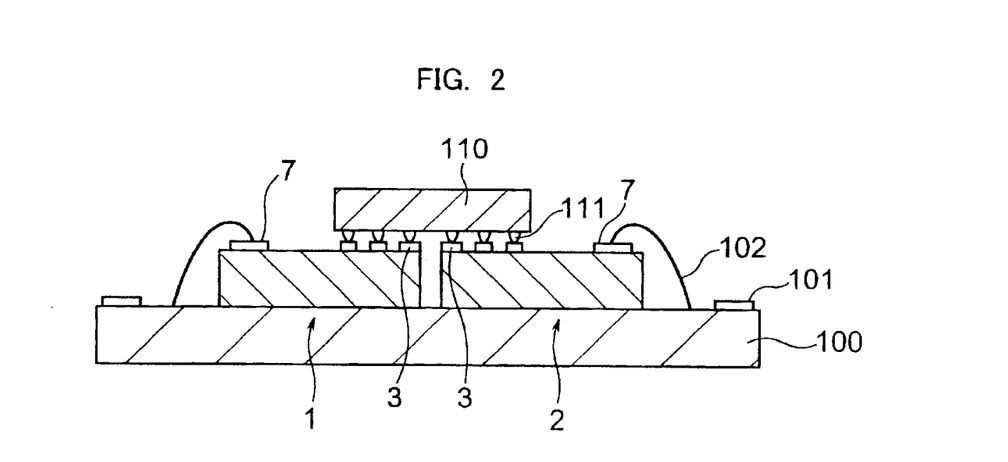
FIG. 2 is a schematic sectional view for explaining an example of a method of electrically connecting between semiconductor chips and a mounting state on a supporting substrate in the electronic circuit apparatus according to a first embodiment.

FIG. 2 is a schematic sectional view for explaining an example of a method of electrically connecting between the semiconductor chips 1 and 2 and a mounting state on the supporting substrate 100.

As shown in FIG. 2, for example, the connection pads 3 of the semiconductor chips 1 and 2 are connected by a connection semiconductor chip 110 forming the connection wiring 4.

Namely, the connection semiconductor chip 110 forming the connection wiring 4 as shown in FIG. 1 is prepared, a surface of the connection wiring 4 of the connection semiconductor chip 110 is brought to face the first and second semiconductor chips 1 and 2, the connection wiring 4 of the connection semiconductor chip 110 and the connection pads 3 of the semiconductor chips 1 and 2 are electrically connected by bumps 111, and the connection semiconductor chip 110 is mounted on the semiconductor chips 1 and 2.

As a result, the connection pads 3 of the first semiconductor chip 1 and the connection pads 3 of the second semiconductor chip 2 are electrically connected via the connection wiring 4 of the connection semiconductor chip 110 mounted thereon.

When applying the above connection method, a surface on an opposite side of a surface forming the electronic circuits 1a and 2a of the semiconductor chips 1 and 2 is brought to face the supporting substrate 100 for mounting, and the test/connection pads 7 of the semiconductor chips 1 and 2 and the not shown wiring formed on the supporting substrate 100 are connected by bonding wire 102. Note that the not shown wiring is connected to the external connection pads 101 formed on the supporting substrate 100, respectively.

In the electronic circuit apparatus configured as above, in a state that the connection semiconductor chip 110 is mounted without forming the bonding wire 102, a test is conducted by bringing the prober to contact the test pads 6 and test/connection pads 7 of the semiconductor chips 1 and 2.

When the electronic circuit apparatus is judged to be good by the test, wiring between the test/connection pads 7 of the semiconductor chips 1 and 2 and the supporting substrate 100 is connected by the bonding wire 102, and the external connection pads 101 formed on the supporting substrate 100 are further connected to pads of a not shown mounting substrate, etc. and provided for use in that state.

Figure 3:
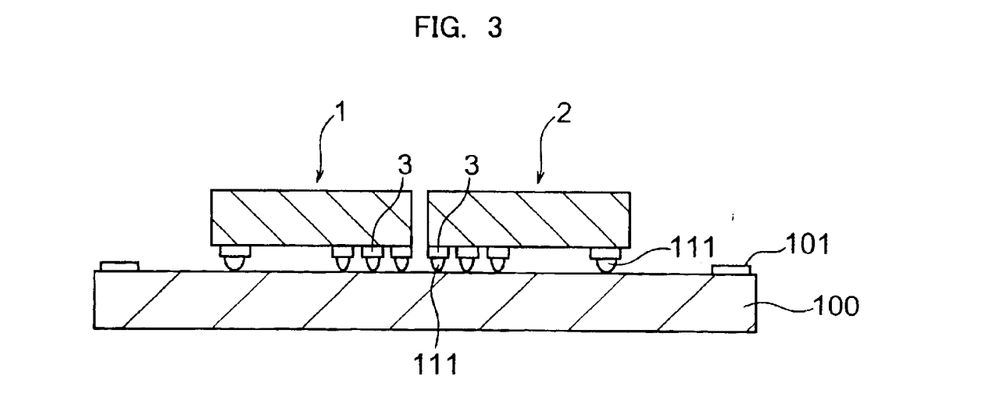
FIG. 3 is a schematic sectional view for explaining another example of a method of electrically connecting between semiconductor chips and a mounting state on a supporting substrate in the electronic circuit apparatus according to a first embodiment.

Also, other than the above method, the semiconductor chips 1 and 2 can be electrically connected by applying a method as shown in FIG. 3.

FIG. 3 is a schematic sectional view for explaining another example of a method of electrically connecting between the semiconductor chips 1 and 2 and a mounting state on the supported substrate 100.

As shown in FIG. 3, for example, the respective semiconductor chips 1 and 2 are mounted on the supporting substrate 100 forming the connection wiring 4 by making a surface forming the connection pads 3 of the semiconductor chips 1 and 2 face the supporting substrate 100. At this time, the connection wiring 4 of the supporting substrate 100 and the connection pads 3 of the respective semiconductor chips 1 and 2 are made via the bumps 111.

The supporting substrate 100 is formed wiring for connecting the test pads 6 and the test/connection pads 7 of the semiconductor chips 1 and 2 other than the connection wiring 4, and between the test pads 6 and the test/connection pads 7 and wiring also is electrically connected by the bumps 111 at the same time. Note that the wiring is connected to each of the connection pads 101 formed around the supporting substrate 100.

In the electronic circuit apparatus configured as above, a test is conducted by bringing the prober to contact the external connection pads 101 electrically connected to the test pads 6 and test/connection pads 7 of the semiconductor chips 1 and 2 by wiring.

When the electronic circuit apparatus is judged to be good by the test, the external connection pads 101 electrically connected to the test/connection pads 7 of the semiconductor chips 1 and 2 by wiring is electrically connected to pads of a not shown mounting substrate by bonding wire and provided for use in that state.

In the electronic circuit apparatus configured as above according to the present embodiment, only the connection pads 3 are allocated to be arranged at a position along one side by which the semiconductor chips 1 and 2 are adjacent to each other, and the input/output interface circuits 5, test pads 6 and external connection pads 7 are arranged along the remaining three sides. Furthermore, the connection pads 3 and the electronic circuits 1a and 2a are configured to be directly connected by inter-connection not via the input/output interface circuits 5.

As explained above, by arranging the connection pads 3 only along the mutually adjacent side, that is, by arranging along the side closest to the other semiconductor chip to be connected, connection at the shortest distance becomes possible by the connection wiring 4, and, furthermore, a signal transmission time can be made shorter.

Also, since the electronic circuits 1a and 2a of the semiconductor chips 1 and 2 are connected by inter-connection and not by detouring to the input/output interface circuits 5, power consumption is suppressed and signal transmission time is made shorter by an amount of omitting the input/output interface circuits 5.

Furthermore, in the present embodiment, an electrical connection between the semiconductor chips 1 and 2 is made not by using the bonding wire but by using the connection wiring 4 formed on the connection, semiconductor chip 110 or the supporting substrate 100 in the same way as in a pre-wafer process, the wiring density can be made high and a high speed operation becomes possible by reducing a signal delay amount. Since the density of the connection wire 4 can be made high, between the respective connection pads 3 can be surely connected, even in the case of gathering the small connection pads 3 to arrange them along one side of the semiconductor chips 1 and 2.

Second Embodiment

Figure 4:
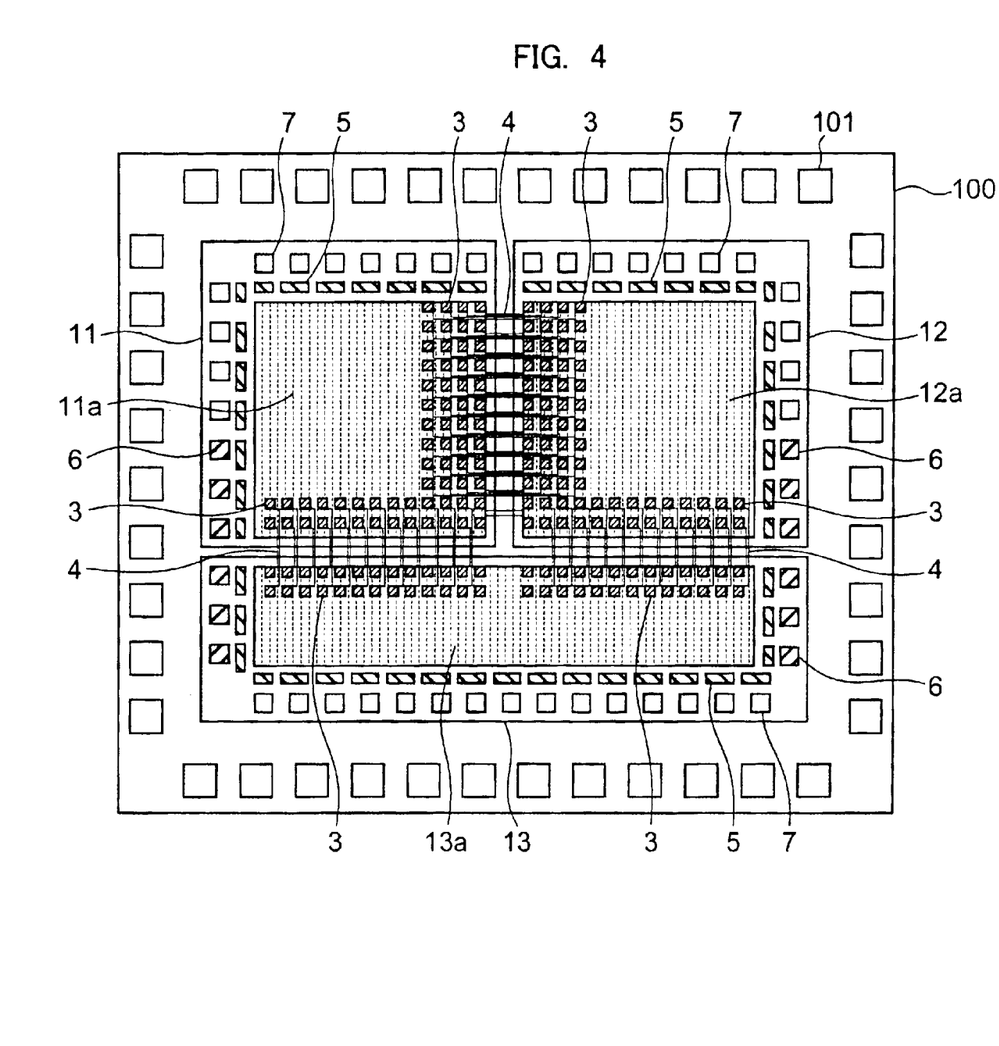
FIG. 4 is a plan view of an example of an electronic circuit apparatus according to a second embodiment.

FIG. 4 is a plan view of an electronic circuit apparatus according to the present embodiment to which a so-called multi-chip module technique is applied.

As shown in FIG. 4, in the electronic apparatus according to the present embodiment, three semiconductor chips 11, 12 and 13 are mounted on a supporting substrate 100 made of silicon, etc. and called an interposer. Note that the same reference numbers are given to the same components as those in FIG. 1, and an explanation thereof will be omitted.

The first semiconductor chip 11 comprises an electronic circuit 11a, such as a logic circuit or a memory circuit, wherein a plurality of connection pads 3 for connecting to a second semiconductor chip 12 and a third semiconductor chip 13 are arranged on the side adjacent to the second and third semiconductor chips 12 and 13, for example, at positions along two sides adjacent to the semiconductor chips 12 and 13.

The connection pads 3 are electrically connected to the electronic circuit 11a by inter-connection (not shown) not via the input/output interface circuits. Also, to attain this arrangement of the connection pads 3, it is preferable to design so that circuit blocks for performing transmission of signals with the second and third semiconductor chips 12 and 13 among circuit blocks composing the electronic circuit 11a of the first semiconductor chip 11 are allocated on the second and third semiconductor chips 12 and 13 side.

Furthermore, on the first semiconductor chip 11 is arranged a plurality of input/output interface circuits 5 connected with the electronic circuit 11a outside the electronic circuit 11a on the sides not adjacent to the second and third semiconductor chips 12 and 13, for example, along two sides other than the sides adjacent to the second and third semiconductor chips 12 and 13.

Outside of the input/output interface circuits 5 is arranged a plurality of test pads 6 and test/connection pads 7 connected to the electronic circuit 11a by inter-connection (not shown) through the input/output interface circuits 5.

The second semiconductor chip 12 comprises an electronic circuit 12a, such as a logic circuit or a memory circuit, wherein a plurality of connection pads 3 for connecting to a first semiconductor chip 11 and a third semiconductor chip 13 at positions along two sides adjacent to the first and third semiconductor chips 11 and 13 are arranged.

The connection pads 3 are electrically connected to the electronic circuit 12a by inter-connection not via any input/output interface circuits. Also, to attain this arrangement of the connection pads 3, it is preferable to design so that circuit blocks for performing transmission of signals with the first and third semiconductor chips 11 and 13 among circuit blocks composing the electronic circuit 12a of the second semiconductor chip 12 are allocated on the first and third semiconductor chips 11 and 13 side.

Furthermore, on the second semiconductor chip 12 is arranged a plurality of input/output interface circuits 5 for connecting with the electronic circuit 12a outside the electronic circuit 12a on the side not adjacent to the first and third semiconductor chips 11 and 13, for example, along two sides other than the sides adjacent to the first and third semiconductor chips 11 and 13.

Outside the input/output interface circuits 5 is arranged a plurality of test pads 6 and test/connection pads 7 connected to the electronic circuit 12a by inter-connection (not shown) through the input/output interface circuits 5.

The third semiconductor chip 13 comprises an electronic circuit 13a, such as a logic circuit or a memory circuit, wherein a plurality of connection pads 3 for connecting with the first and second semiconductor chips 11 and 12 are arranged on the side adjacent to the first and second semiconductor chips 11 and 12, for example, at positions along a side adjacent to the first and second semiconductor chips 11 and 12.

The connection pads 3 are electrically connected with the electronic circuit 13a by inter-connection not via any input/output interface circuits. Also, to attain this arrangement of the connection pads 3, it is preferable to design so that circuit blocks for performing transmission of signals with the first and second semiconductor chips 11 and 12 among circuit blocks composing the electronic circuit 13a of the third semiconductor chip 13 are allocated on the first and second semiconductor chips 11 and 12 side.

Furthermore, on the third semiconductor chip 13 is arranged a plurality of input/output interface circuits 5 for connecting with the electronic circuit 13a outside the electronic circuit 13a on the side not adjacent to the first and second semiconductor chips 11 and 12, for example, along three sides other than the side adjacent to the first and second semiconductor chips 11 and 12.

Outside the input/output interface circuits 5 is arranged a plurality of test pads 6 and test/connection pads 7 connected to the electronic circuit 13a by inter-connection (not shown) via the input/output interface circuits 5.

As a result that between the connection pads 3 of the first semiconductor chip 11 and the second semiconductor chip 12 and between the connection pads 3 of the first and second semiconductor chips 11 and 12 and the third semiconductor chip 13 are connected to each other by the connection wiring 4, electrical connection between the respective semiconductor chips is made.

The electronic circuit apparatus according to the present embodiment is configured as shown in FIG. 4, when assuming the three semiconductor chips 11, 12 and 13 as one group, and the interface circuits 5, the test pads 6 and the external connection pads 7 are arranged around a rim portion of the group of semiconductors 11, 12 and 13 in the same way as in the first embodiment, and has a configuration close to a system LSI wherein the electronic circuits 11a, 12a and 13a are formed on substantially one chip.

The connection between the respective semiconductor chips 11, 12 and 13 and mounting on the supporting substrate 100 can be performed in the same way as in the first embodiment shown in FIG. 2 and FIG. 3.

According to the electronic circuit apparatus configured as above according to the present embodiment, in the same way as in the first embodiment, between the semiconductor chips 11, 12 and 13 can be connected at the shortest distance by the connection wiring 4; also, since between the electronic circuits 11a, 12a and 13a of the semiconductor chips 11, 12 and 13 are connected by an inter-connection not detouring to input/output interface circuits 5, signal transmission time can be made shorter and a power consumption can be suppressed.

Furthermore, electrical connection between the semiconductor chips 11, 12 and 13 is made not by using the bonding wire but by using the connection wiring 4 formed on the connection semiconductor chip 110 or the supporting substrate 100 in the same way as in the pre-wafer process, the wiring density can be made high and a high speed operation becomes possible by reducing the signal delay amount.

Third Embodiment

Figure 5:
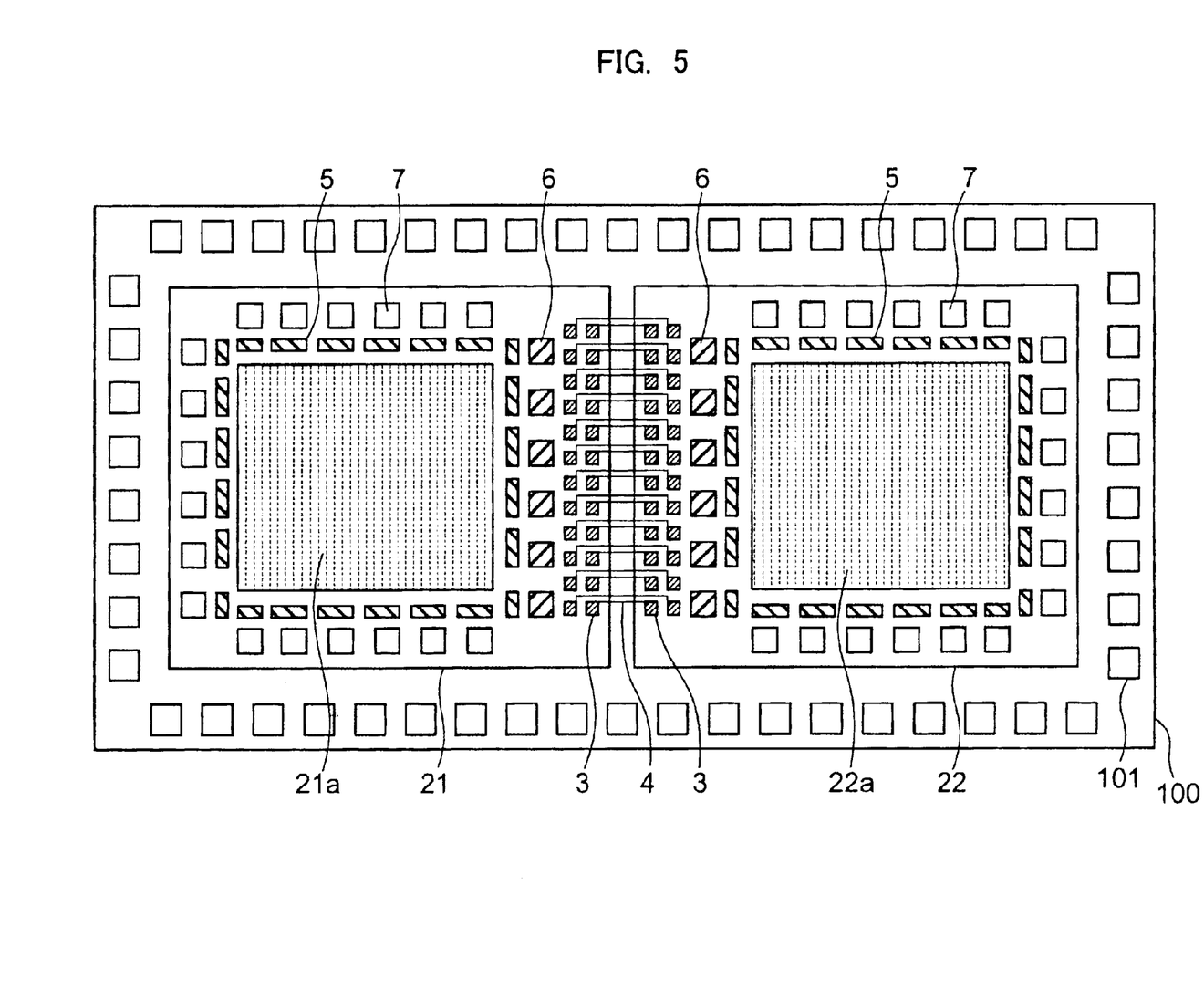
FIG. 5 is a plan view of an example of an electronic circuit apparatus according to a third embodiment.

FIG. 5 is a plan view of an electronic, circuit apparatus according to the present embodiment to which a so-called multi-chip module technique is applied.

As shown in FIG. 5, in the electronic apparatus according to the present embodiment, two semiconductor chips 21 and 22 are mounted on a supporting substrate 100 made of silicon, etc. and called an interposer. Note that the same reference numbers are given to the same components as those in FIG. 1 and an explanation thereof will be omitted.

The first semiconductor chip 21 comprises an electronic circuit 21a, such as a logic circuit or a memory circuit, wherein a plurality of input/output interface circuits 5 connected with the electronic circuit 21a are arranged outside the electronic circuit 21a along four sides of the first semiconductor chip 21.

Also, in the first semiconductor chip 21, a plurality of test pads 6 connected to the input/output interface circuits 5 is arranged outside the input/output interface circuits 5 on the side adjacent to the second semiconductor chip 22, for example, along a side adjacent to the second semiconductor chip 22, and a plurality of connection pads 3 for connecting with the second semiconductor chip 22 is arranged further outside of the test pads 6.

The connection pads 3 are electrically connected to the electronic circuit 21a by inter-connection (not shown) not via any input/output interface circuits 5. Also, to attain this arrangement of the connection pads 3, in accordance with needs, it is preferable to design so that circuit blocks for performing transmission of signals with the second semiconductor chip 22 among circuit blocks composing the electronic circuit 21a of the first semiconductor chip 21 are allocated on the second semiconductor chip 22 side.

Furthermore, in the first semiconductor chip 21, a plurality of test/connection pads 7 connected to the input/output interface circuits 5 is arranged outside of the input/output interface circuits 5 on the side not adjacent to the second semiconductor chip 22, for example, along three sides other than the side adjacent to the second semiconductor chip 22.

The second semiconductor chip 22 comprises an electronic circuit 22a, such as a logic circuit or a memory circuit, wherein a plurality of input/output interface circuits 5 connected with to the electronic circuit 22a is arranged outside the electronic circuit 22a along four sides of the second semiconductor chip 22.

Also, in the second semiconductor chip 22, a plurality of test pads 6 connected to the input/output interface circuits 5 is arranged outside the input/output interface circuits 5 on the side adjacent to the first semiconductor chip 21, for example, along a side adjacent to the first semiconductor chip 21, and a plurality of connection pads 3 for connecting with the first semiconductor chip 21 is arranged further outside of the test pads 6.

The connection pads 3 are electrically connected to the electronic circuit 22a by inter-connection (not shown) not via the input/output interface circuits 5. Also, to attain this arrangement of the connection pads 3, in accordance with needs, it is preferable to design so that circuit blocks for performing transmission of signals with the first semiconductor chip 21 among circuit blocks composing the electronic circuit 22a of the second semiconductor chip 22 are allocated on the first semiconductor chip 21 side.

Furthermore, in the second semiconductor chip 22, a plurality of test/connection pads 7 connected to the input/output interface circuits 5 is arranged outside the input/output interface circuits 5 on the side not adjacent to the first semiconductor chip 21, for example, along three sides other than the side adjacent to the first semiconductor chip 21.

The connection pads 3 of the above first semiconductor chip 1 and second semiconductor chip 2 are connected to each other by the connection wiring 4, so that the first semiconductor chip 21 and the second semiconductor chip 22 are electrically connected.

The connection between the first and second semiconductor chips 21 and 22 by the connection wiring 4 and mounting on the supporting substrate 100 can be made in the same way as in the first embodiment shown in FIG. 2 and FIG. 3.

In the electronic circuit apparatus configured as above according to the present embodiment, being different from the first embodiment, the interface circuits 5 and test circuits 6 are arranged other than the connection pads 3 on the side by which the semiconductor chips 21 and 22 are adjacent to each other, and the interface circuits 5 and the test circuits 6 are formed on a region between the connection pads 3 and the electronic circuits 21a and 22a, and the connection pads 3 are arranged on the outermost side.

Also, in the same way as in the first embodiment, it is configured so that the connection pads 3 and the electronic circuits 21a and 22a are directly connected by inter-connection (not shown) not via the input/output interface circuits 5.

Accordingly, even in the case where the arrangement of the pads explained in the first embodiment cannot be obtained due to a constraint of layout design of a semiconductor chip, connection at the shortest distance becomes possible by the connection wiring 4, and a signal transmission time can be made shorter by arranging the connection pads 3 at a position along a mutually adjacent side in an outermost region.

Also, since the electronic circuits 21a and 22a of the semiconductor chips 21 and 22 are connected by an inter-connection (not shown) not detouring to the input/output interface circuits 5, power consumption can be suppressed and signal transmission time can be made shorter by an amount that the input/output interface circuits 5 are omitted.

Furthermore, since electrical connection between the semiconductor chips 21 and 22 is made not by using bonding wire but by using the connection wiring 4 formed on the connection semiconductor chip 110 or the supporting substrate 100 in the same way as in the pre-wafer process, the wiring density can be made high and a high speed operation becomes possible by reducing a signal delay amount.

Fourth Embodiment

Figure 6:
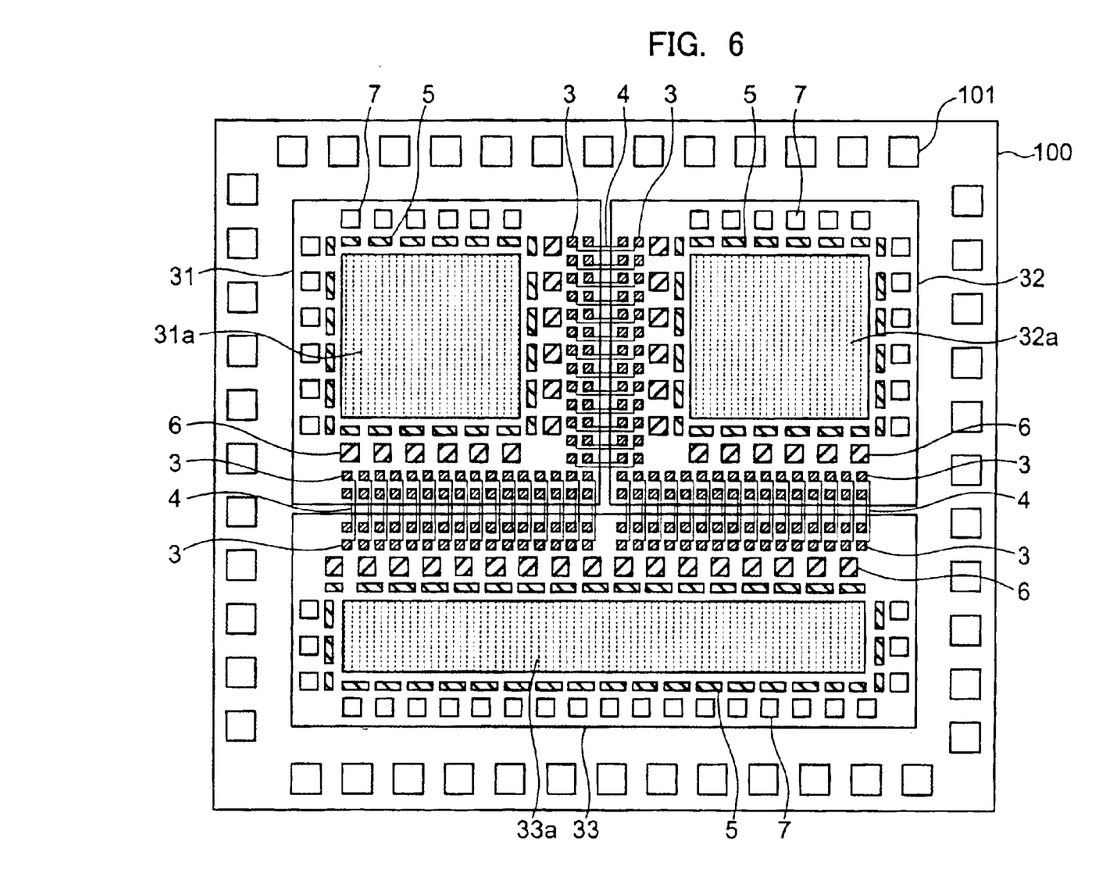
FIG. 6 is a plan view of an example of an electronic circuit apparatus according to a fourth embodiment.

FIG. 6 is a plan view of an electronic circuit apparatus according to the present embodiment to which a so-called multi-chip module technique is applied.

As shown in FIG. 6, in the electronic apparatus according to the present embodiment, three semiconductor chips 31, 32 and 33 are mounted on a supporting substrate 100 made of silicon, etc. and called an interposer. Note that the same reference numbers are given to the same components as those in FIG. 1, and an explanation thereof will be omitted.

The first semiconductor chip 31 comprises an electronic circuit 31a, such as a logic circuit or a memory circuit, wherein a plurality of input/output interface circuits 5 connected to the electronic circuit 31a is arranged outside the electronic circuit 31a along four sides of the first semiconductor chip 31.

Also, in the first semiconductor chip 31, a plurality of test pads 6 connected to the input/output interface circuits 5 is arranged outside the input/output interface circuits 5 on the side adjacent to the second and third semiconductor chips 32 and 33, for example, along two sides adjacent to the second and third semiconductor chips 32 and 33, a plurality of test pads 6 connected to the input/output interface circuits 5 is arranged outside the input/output interface circuits 5, and a plurality of connection pads 3 for connecting with the second and third semiconductor chips 32 and 33 are arranged further outside of the test pads 6.

The connection pads 3 are electrically connected to the electronic circuit 31a by inter-connection (not shown) not via any input/output interface circuits 5. Also, to attain this arrangement of the connection pads 3, in accordance with needs, it is preferable to design so that circuit blocks for performing transmission of signals with the second and third semiconductor chips 32 and 33 among circuit blocks composing the electronic circuit 31a of the first semiconductor chip 31 are allocated on the second and third semiconductor chips 32 and 33 side.

Furthermore, in the first semiconductor chip 31, a plurality of test/connection pads 7 connected to the input/output interface circuits 5 is arranged outside the input/output interface circuits 5 on the side not adjacent to the second and third semiconductor chips 32 and 33, for example, along two sides other than the sides adjacent to the second and third semiconductor chips 32 and 33.

The second semiconductor chip 32 comprises an electronic circuit 32a, such as a logic circuit or a memory circuit, wherein a plurality of input/output interface circuits 5 connected to the electronic circuit 32a is arranged outside the electronic circuit 32a along four sides of the second semiconductor chip 32.

Also, in the second semiconductor chip 32, a plurality of test pads 6 connected to the input/output interface circuits 5 is arranged outside the input/output interface circuit 5 on the side adjacent to the first and third semiconductor chips 31 and 33, for example, along two sides adjacent to the first and third semiconductor chips 31 and 33, and a plurality of connection pads 3 for connecting with the first and third semiconductor chips 31 and 33 is arranged further outside of the test pads 6.

The connection pads 3 are electrically connected to the electronic circuit 32a by inter-connection (not shown) not via any input/output interface circuits 5. Also, to attain this arrangement of the connection pads 3, in accordance with needs, it is preferable to design so that circuit blocks for performing transmission of signals with the first and third semiconductor chips 31 and 33 among circuit blocks composing the electronic circuit 32a of the second semiconductor chip 32 are allocated on the first and third semiconductor chips 31 and 33 side.

Furthermore, in the second semiconductor chip 32, a plurality of test/connection pads 7 connected to the input/output interface circuits 5 is arranged outside the input/output interface circuits 5 on the side not adjacent to the first and third semiconductor chips 31 and 33, for example, along two sides other than the sides adjacent to the first and third semiconductor chips 31 and 33.

The third semiconductor chip 33 comprises an electronic circuit 33a, such as a logic circuit or a memory circuit, wherein a plurality of input/output interface circuits 5 connected to the electronic circuit 33a is arranged outside the electronic circuit 33a along four sides of the third semiconductor chip 33.

Also, in the third semiconductor chip 33, a plurality of test pads 6 connected to the input/output interface circuits 5 is arranged outside the input/output interface circuit 5 on the side adjacent to the first and second semiconductor chips 31 and 32, for example, at a position along one side adjacent to the first and second semiconductor chips 31 and 32, and a plurality of connection pads 3 for connecting with the first and second semiconductor chips 31 and 32 is arranged further outside of the test pads 6.

The connection pads 3 are electrically connected to the electronic circuit 33a by inter-connection (not shown) not via any input/output interface circuits 5. Also, to attain this arrangement of the connection pads 3, in accordance with needs, it is preferable to design so that circuit blocks for performing transmission of signals with the first and second semiconductor chips 3,1 and 32 among circuit blocks composing the electronic circuit 33a of the third semiconductor chip 33 are allocated on the first and second semiconductor chips 31 and 32 side.

Furthermore, in the third semiconductor chip 33, a plurality of test/connection pads 7 connected to the input/output interface circuits 5 is arranged outside the input/output interface circuits 5 on the side not adjacent to the first and second semiconductor chips 31 and 32, for example, along three sides other than the side adjacent to the first and second semiconductor chips 31 and 32.

As a result that between the connection pads 3 of the first semiconductor chip 31 and the second semiconductor chip 32 and between the connection pads 3 of the first and second semiconductor 31 and 32 and the third semiconductor chip 33 are connected to each other by the connection wiring 4, electric connection between the respective semiconductor chips is made.

The connection between the respective semiconductor chips 31, 32 and 33 by the connection wiring 4 and mounting on the supporting substrate 100 can be made in the same way as in the first embodiment shown in FIG. 2 and FIG. 3.

According to the electronic circuit apparatus configured as above according to the present embodiment, in the same way as in the third embodiment, the interface circuits 5 and test circuits 6 are arranged other than the connection pads 3 at positions along the side by which the semiconductor chips 31, 32 and 33 are adjacent to each other, and the interface circuits 5 and the test circuits 6 are formed on a region between the connection pads 3 and the electronic circuits 31a, 32a and 33a, and the connection pads 3 are arranged on the outermost side.

Also, in the same way as in the first embodiment, it is configured so that the connection pads 3 and the electronic circuits 31a, 32a and 33a are directly connected by inter-connection (not shown) not via any input/output interface circuits 5.

Accordingly, even in the case where the arrangement of the pads explained in the first embodiment cannot be obtained due to a constraint of layout design of a semiconductor chip, connection at the shortest distance becomes possible by the connection wiring 4, and a signal transmission time can be made shorter by arranging the connection pads 3 of the respective semiconductor chips at a position adjacent to each other and at the outermost region.

Also, since the electronic circuits 31a, 32a and 33a of the semiconductor chips 31, 32 and 33 are connected by an inter-connection (not shown) not detouring to the input/output interface circuits 5, power consumption can be suppressed and signal transmission time is made shorter by an amount that the input/output interface circuits 5 are omitted.

Furthermore, since electrical connection between the semiconductor chips 31 and 32 is made not by using bonding wire but by using the connection wiring 4 formed on the connection semiconductor chip 110 or the supporting substrate 100 in the same way as in the pre-wafer process, the wiring density can be made high and a high speed operation becomes possible by reducing a signal delay amount.

The electronic circuit apparatus of the present invention is not limited to the above embodiments.

For example, the configuration of the supporting substrate 100 called an interposer is not particularly limited and those having the configuration os the external connection pads being arranged around a mounting surface of semiconductor chips on the supporting substrate 100 as in the present embodiment and the configuration of arranging a plurality of bumps on a back surface of the supporting substrate 100 also can be applied.

Also, an example of electrically connecting the connection pads 3 of the respective semiconductor chips by using the connection semiconductor chip 110 forming the connection wiring 4 and forming the connection wiring 4 on the supporting substrate 100 was explained, but it is not particularly limited to this method.

For example, the connection wiring 4 for connecting respective connection pads 3 can be formed by, after mounting on the supporting substrate 100, forming an insulation film covering the respective semiconductor chips, forming contact holes reaching to connection holes on the insulation film and burying the contact holes.

Other than the above, a variety of modifications may be made within the scope of the present invention.

According to the electronic circuit apparatus of the present invention, a suppression of power consumption and a shorter signal transmission time can be realized by optimizing the arrangement of the device connection terminals between respective unit circuit devices, external connection terminals and input/output interface circuits.

What is claimed is:

1. An electronic circuit apparatus, wherein a plurality of unit circuit devices each having an electronic circuit is mounted adjacent to each other on a substrate, and said unit circuit devices are mutually electrically connected, wherein each of said unit circuit devices comprises;
   an input/output interface circuit;
   a plurality of device connection terminals arranged on a side adjacent to said other unit circuit devices and respectively connected to said electronic circuit by inter-connection not via said input/output interface circuit; and
   a plurality of external connection terminals arranged on a side not adjacent to said other unit circuit devices and respectively connected to said electronic circuit by inter-connection via said input/output interface circuit.

2. An electronic circuit apparatus as set forth in claim 1, wherein
   said unit circuit device comprises a plurality of test terminals for a test on said electronic circuit arranged on a side not adjacent to said other unit circuit devices; and
   said test terminals are connected respectively to said electronic circuit by inter-connection via said input/output interface circuit.

3. An electronic circuit apparatus as set forth in claim 1, wherein
   said unit circuit device has a plurality of test terminals for a test on said electronic circuit arranged on a side adjacent to said other unit circuit devices and inside said device connection terminals; and
   said test terminals are connected respectively to said electronic circuit by inter-connection via said input/output interface circuit.

4. An electronic circuit apparatus as set forth in claim 1, wherein
   said external connection terminals serve as connection terminals for connecting with outside the electronic circuit apparatus and also as connection terminals for a test on said electronic circuit.

5. An integrated circuit device comprising an electronic circuits, a plurality of which mounted adjacent to each other in one module, and said electronic circuits are electrically connected, comprising:
   an input/output interface circuit;
   a plurality of device connection terminals arranged on a side adjacent to other integrated circuit devices when mounted on a module and respectively connected to said electronic circuit by inter-connection not via said input/output interface circuit; and
   a plurality of external connection terminals arranged on a side not adjacent to said other integrated circuit devices and respectively connected to said electronic circuit by inter-connection via said input/output interface circuit.

6. An integrated circuit device as set forth in claim 5, wherein
   said unit circuit device comprises a plurality of test terminals for a test on said electronic circuit arranged on a side not adjacent to said other unit circuit devices; and
   said test terminals are connected respectively to said electronic circuit by inter-connection via said input/output interface circuit.

7. An integrated circuit device as set forth in claim 5, wherein
   said unit circuit device has a plurality of test terminals for a test on said electronic circuit arranged on a side adjacent to said other unit circuit devices and inside said device connection terminals; and
   said test terminals are connected respectively to said electronic circuit by inter-connection via said input/output interface circuit.

8. An integrated circuit device as set forth in claim 5, wherein
   said external connection terminals serve as connection terminals for connecting with outside the electronic circuit apparatus and also as connection terminals for a test on said electronic circuit.

* * * * *